United States Patent
Wi

(10) Patent No.: US 7,285,916 B2
(45) Date of Patent: Oct. 23, 2007

(54) MULTI CHAMBER PLASMA PROCESS SYSTEM

(75) Inventor: Soon-Im Wi, Suwon-si (KR)

(73) Assignee: New Power Plasma Co., Ltd., Suwon-Si, Gyeonggi-do (KR)

( * ) Notice: Subject to any disclaimer, the term of this patent is extended or adjusted under 35 U.S.C. 154(b) by 258 days.

(21) Appl. No.: 11/192,414

(22) Filed: Jul. 29, 2005

(65) Prior Publication Data
US 2007/0012563 A1    Jan. 18, 2007

(30) Foreign Application Priority Data
Jul. 15, 2005    (KR)    ............ 10-2005-0064191

(51) Int. Cl.
*H01J 7/24*    (2006.01)

(52) U.S. Cl. ............... 315/111.21; 118/719; 118/723 I; 204/298.35; 156/345.32

(58) Field of Classification Search ........... 315/111.21, 315/111.41, 111.51; 118/719, 723 I, 723 IR; 204/298.35, 298.39, 298.25; 156/345.48, 156/345.49, 345.51, 345.54, 345.31, 345.32
See application file for complete search history.

(56) References Cited

U.S. PATENT DOCUMENTS

| | | | | |
|---|---|---|---|---|
| 5,558,751 | A * | 9/1996 | Mahler et al. | 204/298.26 |
| 6,017,221 | A * | 1/2000 | Flamm | 204/192.32 |
| 6,213,050 | B1 * | 4/2001 | Liu et al. | 118/723 IR |
| 6,222,718 | B1 * | 4/2001 | Dible | 361/234 |
| 6,486,431 | B1 * | 11/2002 | Smith et al. | 315/111.51 |
| 6,822,396 | B2 * | 11/2004 | Gonzalez et al. | 315/111.51 |
| 6,836,073 | B2 * | 12/2004 | Matsushita | 315/111.21 |
| 6,962,644 | B2 * | 11/2005 | Paterson et al. | 156/345.32 |
| 2002/0121345 | A1 * | 9/2002 | Chen et al. | 118/719 |
| 2003/0196757 | A1 * | 10/2003 | Todorow et al. | 156/345.24 |

* cited by examiner

*Primary Examiner*—Douglas W. Owens
*Assistant Examiner*—Ephrem Alemu
(74) *Attorney, Agent, or Firm*—Robert E. Bushnell, Esq.

(57) ABSTRACT

A multi-chamber plasma process system includes a plurality of process chambers, each of which has an inductively coupled plasma generator. The inductively coupled plasma generator is electrically connected to a main power supply through a first impedance matcher. The first impedance matcher has at least one variable inductor. Ignition electrodes of the inductively coupled plasma generators are connected in parallel with an ignition power supply configured as a variable transformer. The variable inductor of the first impedance matcher and the variable transformer of the ignition power supply are controlled by a controller. Each process chamber has a plasma density regulator. Power supply systems, including an ignition power source, a radio frequency (RF) power source, an impedance matcher, etc. can be effectively integrated. As a result, it is possible to decrease the area of facilities and the cost of the system, and to individually control the plasma density of each process chamber. Accordingly, process yield is improved, and productivity of the system is further improved.

19 Claims, 14 Drawing Sheets

MULTI CHAMBER PLASMA PROCESS SYSTEM

CLAIM OF PRIORITY

This application makes reference to, incorporates the same herein, and claims all benefits accruing under 35 U.S.C. §119 from an application entitled MULTI CHAMBER PLASMA PROCESS SYSTEM earlier filled in the Korean Intellectual Property Office on 15 Jul. 2005 and there duly assigned Serial No. 2005-64191.

BACKGROUND OF THE INVENTION

1. Technical Field

The present invention relates to a multi-chamber system and, more particularly, to a multi-chamber plasma process system in which an inductively coupled plasma (ICP) process chamber has a multiple construction, thereby being capable of processing, in parallel, substrates to be processed, such as semiconductor substrates or liquid crystal glass substrates.

2. Related Art

As is well known in the semiconductor industry for manufacturing semiconductor integrated circuitry or liquid crystal displays, a multi-chamber system is put to practical use to enhance productivity. The multi-chamber system has a structure wherein a number of process chambers are arranged either in a cluster type or around a substrate flow path formed by a conveyor or track. In the multi-chamber system, the process chambers are arranged horizontally or stacked in two or more chambers.

In the current semiconductor industry, the substrate to be processed shows a tendency toward an increase in diameter, and the integrated circuit shows a tendency toward a fine pattern, high precision, complication, etc. The result is an increase in complex processes as well as batch processing requests. In this respect, the multi-chamber system facilitates coping with the complex processes, and can improve productivity due to the reduction in processes caused by batch processing.

In order to enhance productivity per unit area, the multi-chamber system is necessary in order to more effectively dispose of each component, and in order to integrate parts which can be integrated. In most multi-chamber systems, each of the process chambers may be inefficient because it has an individual power supply structure. Thus, in the multi-chamber system, there is a need to decrease the area of the facilities and the cost by means of effective integration in the power supply structure.

A plasma process which can be widely used in the semiconductor manufacturing process is very important for the generation of plasma and for the maintenance of a proper density of the plasma according to a process characteristic. In order to effectively integrate the power supply structure, the multi-chamber system having plasma process chambers employing an inductively coupled plasma technique must be designed in order to make sufficient allowance for the supply of ignition power, the supply of high-frequency power, the matching of impedances and the like. Furthermore, the plasma density of each process chamber must be adjusted according to the process characteristic.

SUMMARY OF THE INVENTION

Therefore, the present invention is directed to the provision of a multi-chamber plasma process system having inductively coupled plasma process chambers and effectively integrating power supply systems including ignition power sources, radio-frequency power sources, impedance matchers, etc., thereby decreasing the area of facilities and the cost of the multi-chamber system, and improving the process yield by individually controlling the density of plasma of each process chamber. Thus, productivity of the multi-chamber system as a whole is improved.

In accordance with an exemplary embodiment, the present invention provides a multi-chamber plasma process system which comprises: a plurality of process chamber, each having an inductively coupled plasma generator; a main power supply for supplying radio frequency (RF) power for the generation of plasma to each inductively coupled plasma generator; a first impedance matcher connected between the main power supply and the inductively coupled plasma generator; an ignition power supply supplied with RF power from the main power supply, and supplying ignition power to an ignition electrode provided in the inductively coupled plasma generator; a plurality of bias power sources for supplying bias power to a susceptor provided in each of the plurality of process chambers; a plurality of second impedance matchers connected between the susceptors and the bias power sources; and a controller for controlling the first impedance matcher, the plurality of second impedance matchers, and the ignition power supply.

Preferably, the inductively coupled plasma generators provided in the plurality of process chambers are electrically connected in series with the main power supply through the first impedance matcher. The ignition electrodes provided in the inductively coupled plasma generators are, preferably, connected in parallel with the ignition power supply.

Preferably, the plurality of process chambers are in a stacked structure having at least two stacked process chambers or a cluster structure.

Preferably, each of the first impedance matcher and the plurality of second impedance matchers includes at least one variable inductor for impedance matching. The variable inductor may include first and second magnetic cores which have a horseshoe shape, and which have both ends disposed opposite to each other, first and second winding coils wound around the first and second magnetic cores, respectively, and a driving unit for moving the first and/or second magnetic cores based on control by the controller so as to vary the relative position between the first and second magnetic cores. In the variable inductor, as the relative position between the first and second magnetic cores is varied, magnetic flux induced by the first and second winding coils has an aligned or deflected direction or an inverse direction, and as a result inductance caused by the first and second winding coils may be varied. Furthermore, as the relative distance between the first and second magnetic cores is varied, the magnetic flux induced by the first and second winding coils may cause an amount of magnetic flux concentrated in the first and second magnetic cores to be increased or decreased, and as a result the inductance caused by the first and second winding coils may be varied.

Preferably, each of the first impedance matcher and the plurality of second impedance matchers includes at least one variable inductor for impedance matching. The variable inductor may include first and second hollow tubes which have both ends opened, and which are disposed in parallel, first and second continuous winding coils wound around the first and second magnetic cores, respectively, first and second magnetic cores which are mounted on the first and second hollow tubes, and having a horseshoe shape with both ends disposed opposite to each other, and a driving unit for moving the first and/or second magnetic cores based on control by the controller so as to vary the relative distance between the first and second magnetic cores. In the variable inductor, as the relative distance between the first and second magnetic cores is varied, the magnetic flux induced by the first and second winding coils causes the amount of magnetic flux concentrated in the first and second magnetic cores to be increased or decreased, and as a result inductance caused by the first and second winding coils is varied. The first and second hollow tubes are, preferably, an insulator Preferably, the ignition power supply includes a variable transformer which is connected to the power supply on a primary side thereof, and which is connected in parallel with the ignition electrodes of the inductively coupled plasma generators on the secondary side. The variable transformer includes first and second magnetic cores which have a horseshoe shape, and which have both ends disposed opposite to each other, a first winding coil wound around the first magnetic core, a second winding coil wound around the second magnetic core, and a driving unit for moving the first and/or second magnetic cores based on control by the controller so as to vary a relative position between the first and second magnetic cores. In the variable transformer, as the relative position between the first and second magnetic cores is varied, magnetic flux induced by the first and second winding coils has an aligned or deflected direction or an inverse direction, and as a result inductance caused by the first and second winding coils is varied. Furthermore, as the relative distance between the first and second magnetic cores is varied, the magnetic flux induced by the first and second winding coils causes the amount of magnetic flux concentrated in common in the first and second magnetic cores to be increased or decreased, and as a result induced electromotive force transmitted from the primary winding coil to the secondary winding coil is varied.

Preferably, each of the process chambers has at least two holes on a ceiling of a chamber housing in which a susceptor is disposed, the susceptor having a substrate to be processed rested thereon. The inductively coupled plasma generator preferably includes at least one external discharge bridge having a hollow C shape and having one side coupled to the holes, at least one donut-like magnetic core mounted on the external discharge bridge, and an induction coil wound around the magnetic core and connected to the main power supply through the first impedance matcher. The induction coil induces electromotive force so as to form a plasma discharge path inside the external discharge bridge and inside the chamber housing. The external discharge bridge and the chamber housing preferably have an insulator layer formed on inner surfaces thereof.

Preferably, the inductively coupled plasma generator includes a plasma density regulator. The plasma density regulator includes a density regulation flat plate mounted across an inner upper discharge space of the external discharge bridge and formed with holes, and a driving unit for moving the density regulation flat plate up and down. Thereby, the plasma increases in density as the density regulation flat plate moves upward, while the plasma decreases in density as the density regulation flat plate moves downward.

Preferably, each of the process chambers has a plurality of holes on a ceiling of a chamber housing in which a susceptor is disposed. The susceptor has a substrate to be processed rested thereon. The inductively coupled plasma generator includes: a hollow discharge tube head having a plurality of holes on a lower surface thereof so as to correspond to the plurality of holes formed on the ceiling of the chamber housing and having a gas inlet on an upper surface thereof; a plurality of hollow discharge tube bridges, each connected between the plurality of holes formed on the ceiling of the chamber housing and the plurality of holes formed on the lower surface of the hollow discharge tube head and corresponding to the plurality of holes formed on the ceiling; a donut-like magnetic core mounted on the hollow discharge tube bridges; and an induction coil wound around the magnet core and connected to the main power supply through the first impedance matcher. In this regard, the induction coil induces an electromotive force so as to form a plasma discharge path connecting interiors of the hollow discharge tube head, the plurality of hollow discharge bridges and the chamber housing. The magnetic core need not be mounted on at least one of the plurality of hollow discharge bridges. The hollow discharge tube head, the plurality of hollow discharge bridges and the chamber housing have an insulator layer formed on inner surfaces thereof.

Preferably, the inductively coupled plasma generator includes a plasma density regulator. The plasma density regulator preferably includes a density regulation flat plate mounted across an inner discharge space of the hollow discharge tube head and formed with holes, and a driving unit for moving the density regulation flat plate up and down. In this regard, the plasma increases in density as the density regulation flat plate moves upward, while the plasma decreases in density as the density regulation flat plate moves downward.

Preferably, each of the process chambers has an inductively coupled plasma generator disposed in an inner upper space of a chamber housing in which a susceptor is disposed. The inductively coupled plasma generator includes an annular hollow core jacket positioned on the upper space of the chamber housing, a hollow discharge tube head having a plurality of holes on a lower surface so as to correspond to the plurality of holes formed on the ceiling of the chamber housing and having a gas inlet on an upper surface thereof, a plurality of hollow discharge tube bridges each connected between the plurality of holes formed on the ceiling of the chamber housing and the plurality of holes formed on the lower surface of the hollow discharge tube head and corresponding to the plurality of holes formed on the ceiling, at least one fixing bridge extending from an upper sidewall of the chamber housing to the hollow core jacket so as to fix the hollow core jacket in the upper space of the chamber housing, an annular magnetic core mounted in the hollow core jacket, and an induction coil wound around the annular magnetic core. In this case, the induction coil induces an electromotive force to form a plasma discharge path surrounding the exterior of the hollow core jacket. The hollow core jacket and the fixing bridge are preferably formed of an insulator, and the chamber housing has an insulator layer formed on an inner surface thereof.

Preferably, the inductively coupled plasma generator includes a plasma density regulator. The plasma density regulator preferably includes a density regulation flat plate mounted across an inner upper space of the chamber housing over the hollow core jacket, and a driving unit for moving the density regulation flat plate up and down. In this case, the plasma increases in density as the density regulation flat plate moves upward, while the plasma decreases in density as the density regulation flat plate moves downward.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
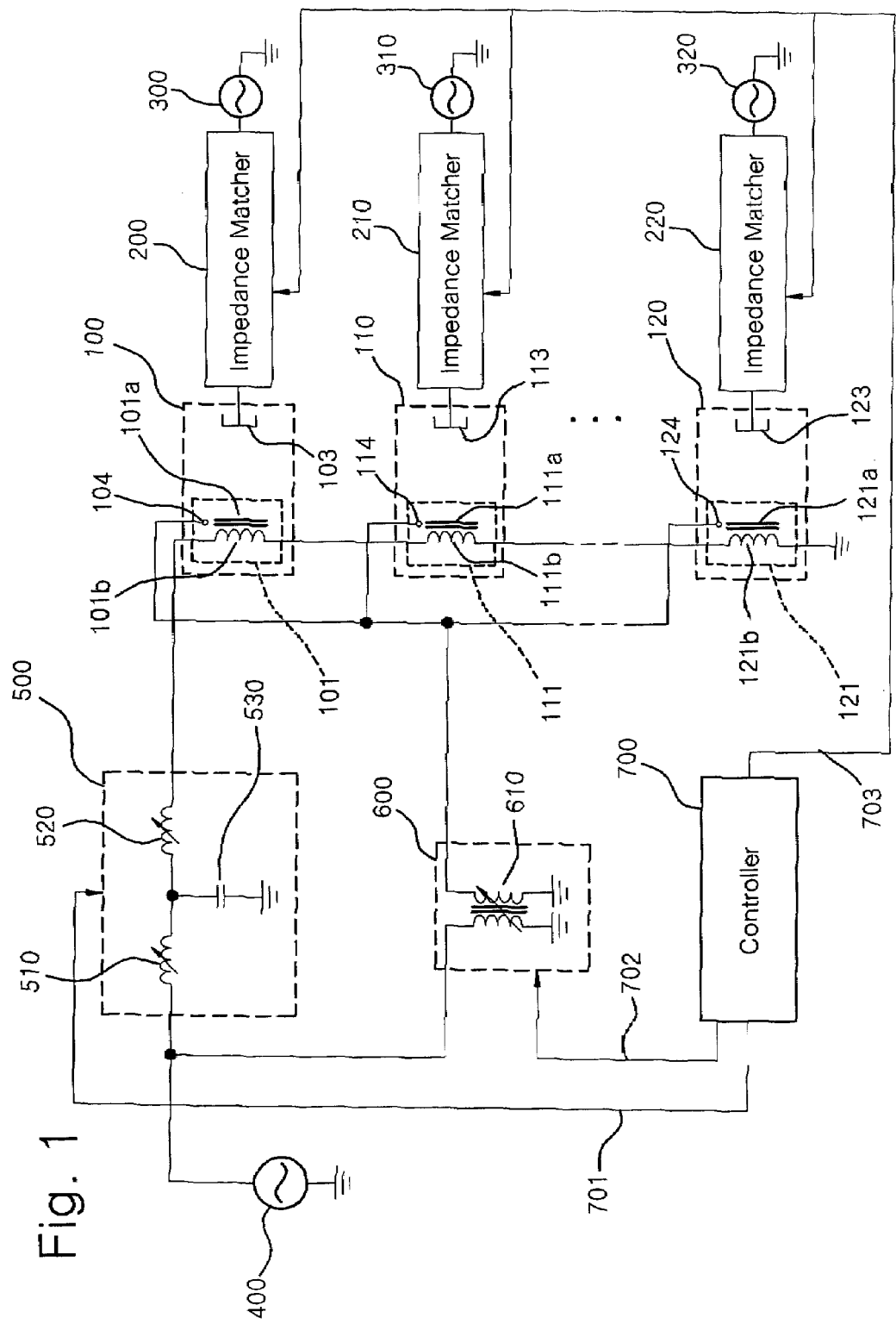
FIG. 1 is a circuit diagram of a multi-chamber plasma process system of the present invention.

Hereinafter, a multi-chamber plasma process system of the present invention will be described in detail with reference to the attached drawings, in which exemplary embodiments of the invention are shown. This invention may, however, be embodied in different forms, and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIG. 1 is a circuit diagram of a multi-chamber plasma process system of the present 11 invention.

The multi-chamber plasma process system has a plurality of process chambers 100, 110 and 120. The plurality of process chambers 100, 110 and 120 are provided with inductively coupled plasma generators 101, 111 and 121, respectively. The inductively coupled plasma generators 101, 111 and 121 include magnetic cores 101a, 111a and 121a and winding coils 101b, 111b and 121b wound around the magnetic cores 101a, 111a and 121a, respectively. The inductively coupled plasma generators 101, 111 and 121 are electrically connected in series with a main power supply 400 through a first impedance matcher 500.

The main power supply 400 supplies radio frequency (RF) power to the inductively coupled plasma generators 101, 111 and 121 through the first impedance matcher 500. The main power supply 400 supplies the RF power to an ignition power supply 600. The ignition power supply 600, supplied with RF power by the main power supply 400, thus supplies ignition power to ignition electrodes 104, 114 and 124 which are mounted in the inductively coupled plasma generators 101, 111 and 121, respectively.

Each process chamber 100, 110 and 120 has a susceptor 103, 113 and 123, respectively. The susceptors 103, 113 and 123 are connected to bias power sources 300, 310 and 320, respectively, through second impedance matchers 200, 210 and 220, respectively.

The first impedance matcher 500, the second impedance matchers 200, 210 and 220, and the ignition power supply 600 are controlled by a controller 700. For the purpose of impedance matching, the controller 700 outputs a first control signal 701 for controlling the first impedance matcher 500, a second control signal 702 for controlling the ignition power supply 600, and a third control signal 703 for controlling the second impedance matchers 200, 210 and 220.

The first impedance matcher 500 includes first and second variable inductors 510 and 520, respectively, which are connected in series between input and output terminals, and a capacitor 530 which is connected between a connection node of the first and second variable inductors 510 and 520, respectively, and ground. The first and second variable inductors 510 and 520, respectively, have an inductance value which varies depending on the first control signal 701 of the controller 700. The first and second variable inductors 510 and 520, respectively, will be described below in detail.

The ignition power supply 600 is composed of a variable transformer 610, a primary side of which is connected to the main power supply 400, and a secondary side of which is connected in parallel with the ignition electrodes 104, 114 and 124 of the inductively coupled plasma generators 101, 111 and 121, respectively. The variable transformer 610 has a secondary side inductive voltage which varies depending on the second control signal 702 from the controller 700. As described in detail below, the controller 700 causes the ignition power supply 600 to supply ignition power for plasma igniting in the inductively coupled plasma generators 101, 111 and 121, and to cut off supply of the ignition power after plasma discharge occurs, thereby performing an interruption function in the operation of the variable transformer 610.

The second impedance matchers 200, 210 and 220 may have the same configuration as the above-mentioned first impedance matcher 500. The second impedance matchers 200, 210 and 220 perform the operation of impedance matching on the basis of the third control signal 703 from the controller 700.

Figure 2:
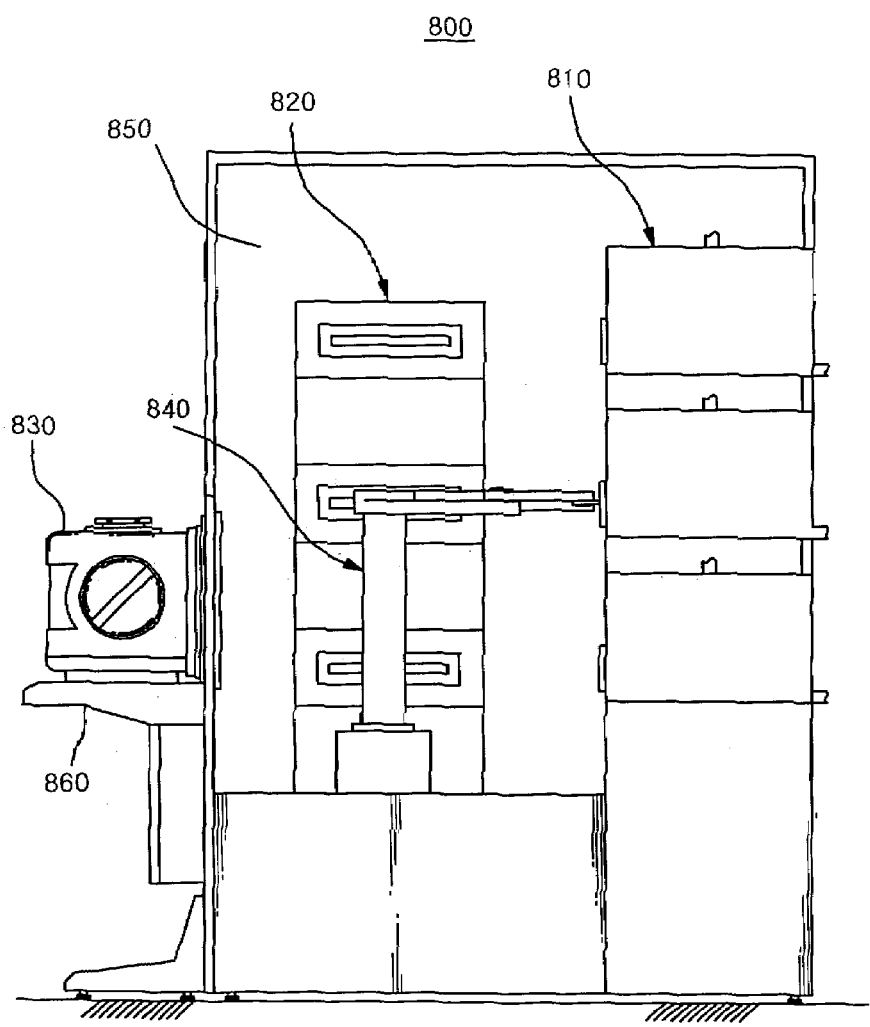
FIG. 2 shows process chambers formed in a stacked structure in a multi-chamber plasma process system of the present invention.

FIG. 2 shows process chambers formed in a stacked structure in a multi-chamber plasma process system of the present invention.

As shown in FIG. 2, the multi-chamber plasma process system 800 may be constructed to have a structure wherein two or more process chambers 810 are vertically stacked in a transfer chamber 850. The stacked process chambers 810 are provided in the front portion of transfer chamber 850 with a transfer robot 840 that can move them vertically up and down. One or more cooling or heating stages 820 are stacked in the transfer chamber 850.

In this manner, the multi-chamber plasma process system may be constructed either by stacking two or more process chambers 810, or by disposing a plurality of process chambers in a cluster structure. Although not described in detail, the plurality of process chambers 810 may be variously disposed using a transfer system, such as a track or conveyor system.

The multi-chamber plasma process system of the present invention is adapted not only to have an intensive disposition structure of the stacked or cluster type, but also to effectively integrate the power supply systems, including the ignition power sources, RF power sources, impedance matchers and the like, thereby improving productivity as well as decreasing the area of the facility and the cost effectively.

Figure 3:
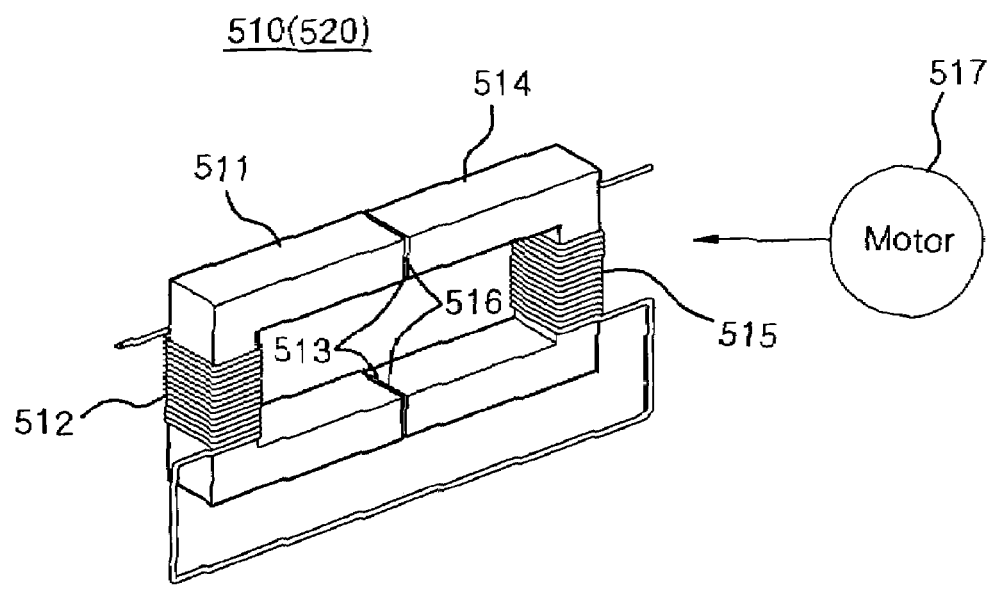
FIG. 3 is a perspective view of one embodiment of the variable inductors constituting the first impedance matcher of FIG. 1.

FIG. 3 is a perspective view of one embodiment of the variable inductors constituting the first impedance matcher of FIG. 1.

Referring to FIG. 3, the variable inductors 510 and 520 constituting the first impedance matcher 500 of FIG. 1 have a structure suitable for high RF power. Each of the variable inductors 510 and 520 has first and second magnetic cores 511 and 514, respectively, which have a horseshoe shape and which have both ends disposed opposite to each other. The first and second magnetic cores 511 and 514, respectively, are wound with first and second winding coils 512 and 515, respectively. The first and second winding coils 512 and 515, respectively, form a continuous winding.

Each of the variable inductors 510 and 520 has a driving unit or motor 517 for varying the relative position between the first and second magnetic cores 511 and 514, respectively, so as to vary the inductance caused by the first and second winding coils 512 and 515, respectively. The driving unit 517 may be, for example, an electric motor. The driving unit 517 is controlled by the first control signal 701 from the controller 700.

Figure 4A:
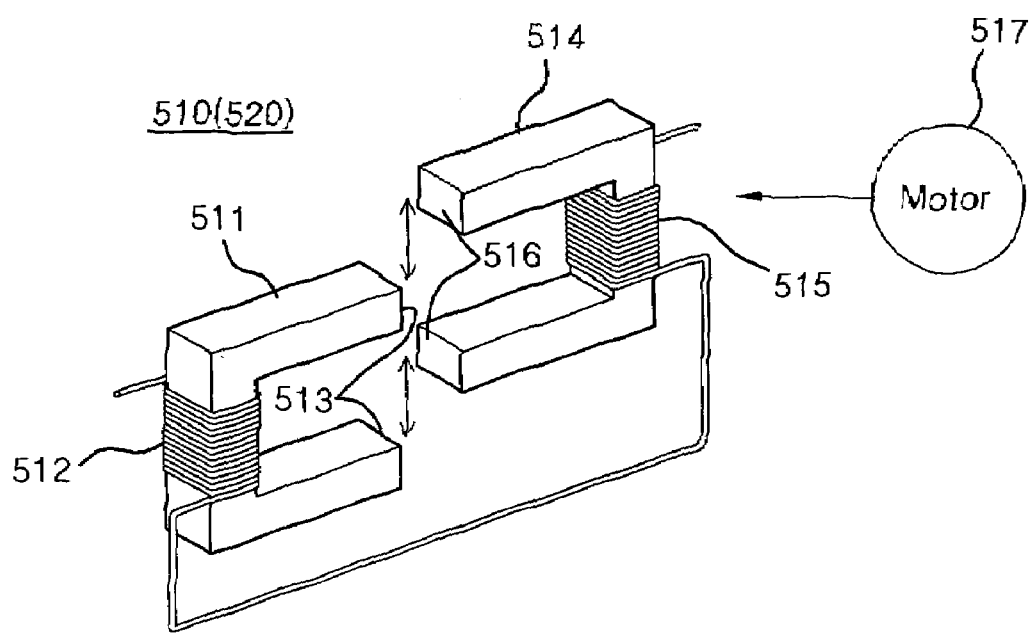
FIGS. 4a to 4c show examples wherein the relative position between the first and second magnetic cores is varied.
Figure 4B:
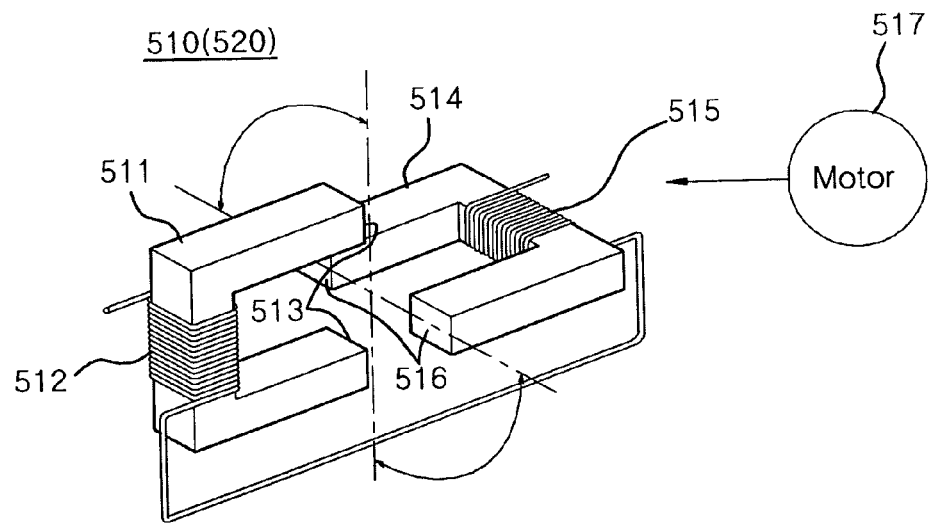
Figure 4C:
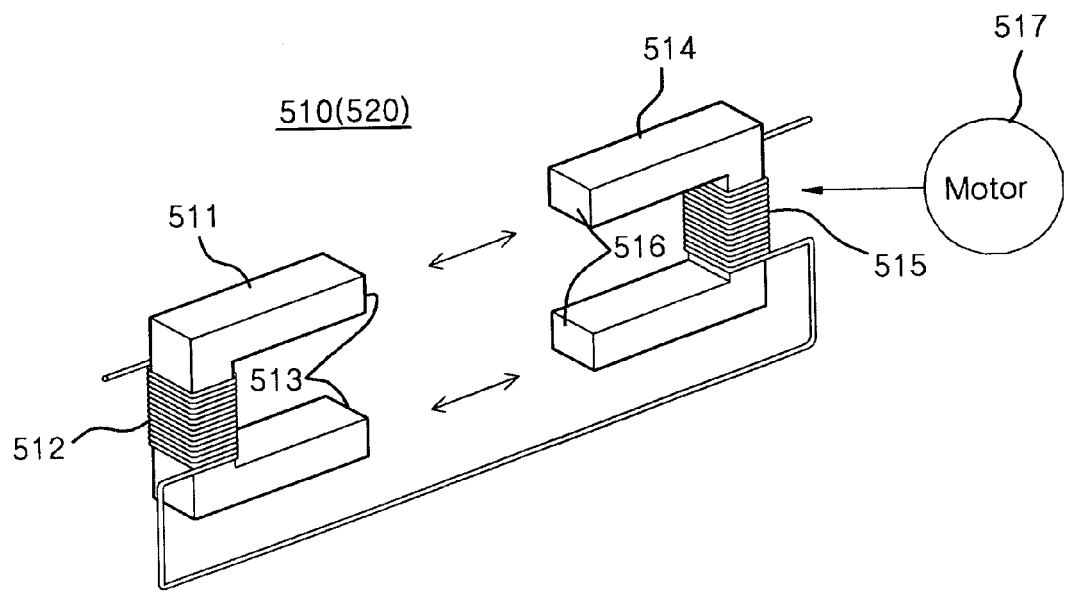

FIGS. 4a to 4c show examples wherein the relative position between the first and second magnetic cores 511 and 514, respectively, is varied by the driving unit 517, thereby varying the inductance of the variable inductors 510 and 520.

As shown in FIG. 4a, the first and second magnetic cores 511 and 514, respectively, are displaced in a vertical (or horizontal) direction by the driving unit 517 so that magnetic flux input and output parts 513 and 516, respectively, are aligned or deflected. In this case, according to the degree of deflection, each of the variable inductors 510 and 520 is subjected to variation in inductance.

In another example, as shown in FIG. 4b, the first and second magnetic cores 511 and 514, respectively, are rotated by the driving unit 517 so that the magnetic flux input and output parts 513 and 516, respectively, are aligned or crossed, or have an inverse direction. In this case, according to the rotational angle, each of the variable inductors 510 and 520 varies in inductance.

As set forth above, as the relative position between the first and second magnetic cores 511 and 514, respectively (the vertically or horizontally deflected degree or crossed rotational angle), is varied, the magnetic flux induced by the first and second winding coils 512 and 515, respectively, has an aligned or deflected direction, or an inverse direction. As a result, each of the variable inductors 510 and 520 varies in inductance by virtue of the first and second winding coils 512 and 515, respectively.

In another example, as shown in FIG. 4c, the first and second magnetic cores 511 and 514, respectively, are displaced by the driving unit 517 so that the relative distance between the magnetic flux input and output parts 513 and 516, respectively, is near or distant. In this case, according to the relative distance, each of the variable inductor 510 and 520 varies in inductance. To be more specific, in the variable inductors 510 and 520, as the relative distance between the first and second magnetic cores 511 and 514, respectively, is varied, the magnetic flux induced by the first and second winding coils 512 and 515, respectively, causes the amount of the magnetic flux concentrated in the first and second magnetic cores 511 and 514, respectively, to increase or decrease. As a result, the inductance of the first and second winding coils 512 and 515, respectively, is varied.

Figure 5:
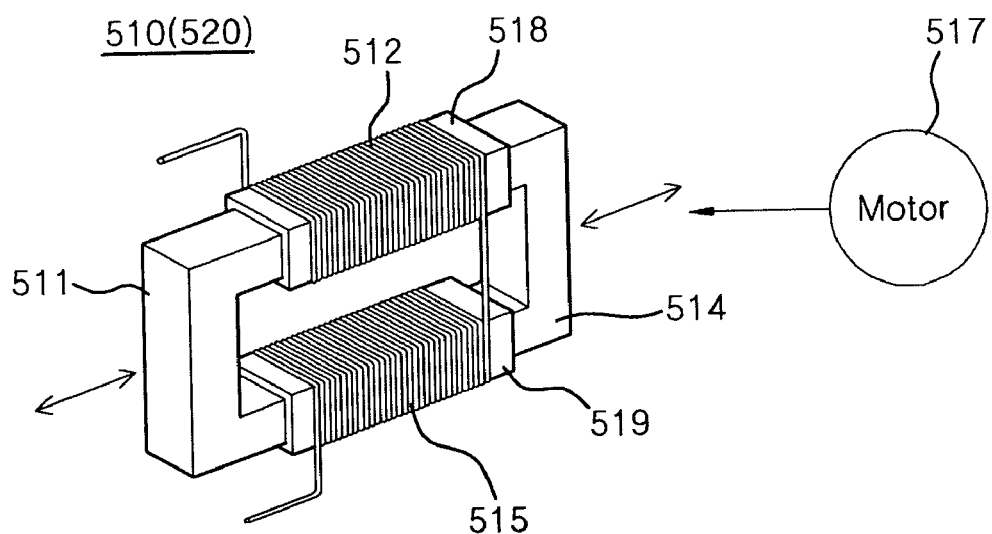
FIG. 5 is a perspective view of another embodiment of the variable inductors constituting the first impedance matcher of FIG. 1.

FIG. 5 is a perspective view of another embodiment of the variable inductors constituting the first impedance matcher of FIG. 1.

Referring to FIG. 5, each variable inductor 510 and 520 has first and second hollow tube 518 and 519, respectively, which have both ends opened and which are arranged in parallel. The first and second hollow tubes 518 and 519, respectively, are wound with first and second winding coils 512 and 515, respectively. The first and second winding coils 512 and 515, respectively, form a continuous winding. The first and second hollow tube 518 and 519, respectively, are mounted on first and second magnetic cores 511 and 514, respectively, wherein the first and second magnetic cores 511 and 514, respectively, have a horseshoe shape and are opposite to each other. Each of the variable inductor 510 and 520 includes, for example, a driving unit 517, which is used for displacing the first and/or second magnetic cores 511 and/or 514, respectively, under the control of the controller 700 so as to vary the relative distance between the first and second magnetic cores 511 and 514, respectively.

In the variable inductors 510 and 520, as the relative distance between the first and second magnetic cores 511 and 514, respectively, is varied, the magnetic flux induced by the first and second winding coils 512 and 515, respectively, causes the amount of magnetic flux concentrated in the first and second magnetic cores 511 and 514, respectively, to increase or decrease. As a result, the inductance caused by the first and second winding coils 512 and 515, respectively, varies.

Variable inductors may be provided in the second impedance matchers 200, 210 and 220 (FIG. 1), and may be constructed in a manner similar to the construction of the variable inductors 510 and 520 of FIG. 5. The variable inductors installed in the plurality of second impedance matchers 200, 210 and 220 perform control operations for impedance matching on the basis of the third control signal 703 from the controller 700.

Figure 6:
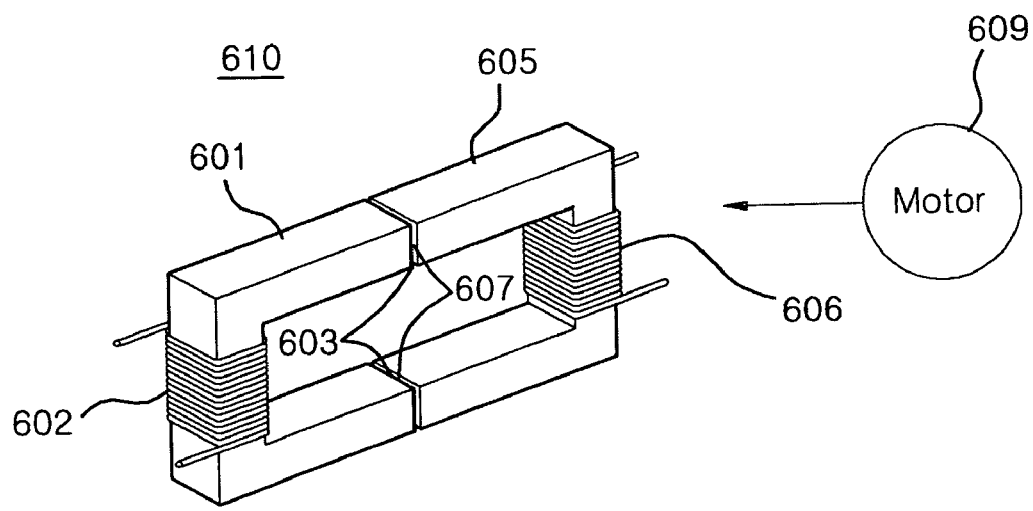
FIG. 6 is a perspective view of the variable transformer constituting the ignition power supply of FIG. 1.
Figure 7A:
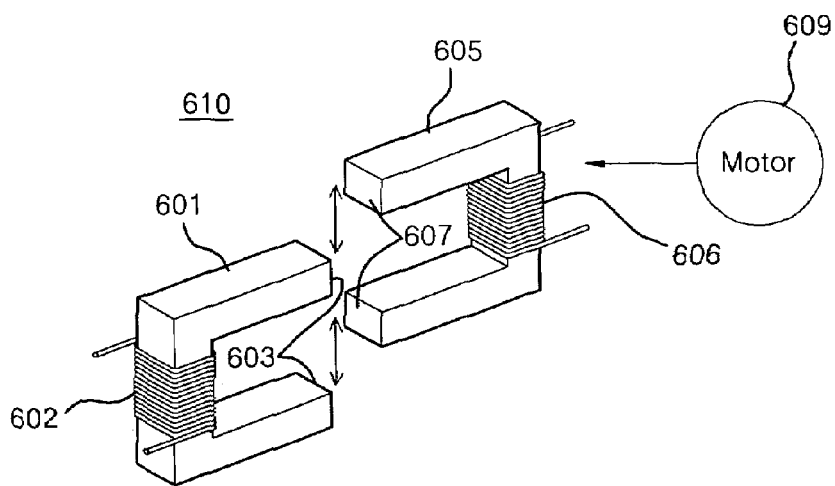
FIGS. 7a to 7c are views for explaining a variable control mode of the variable transformer of FIG. 6.
Figure 7B:
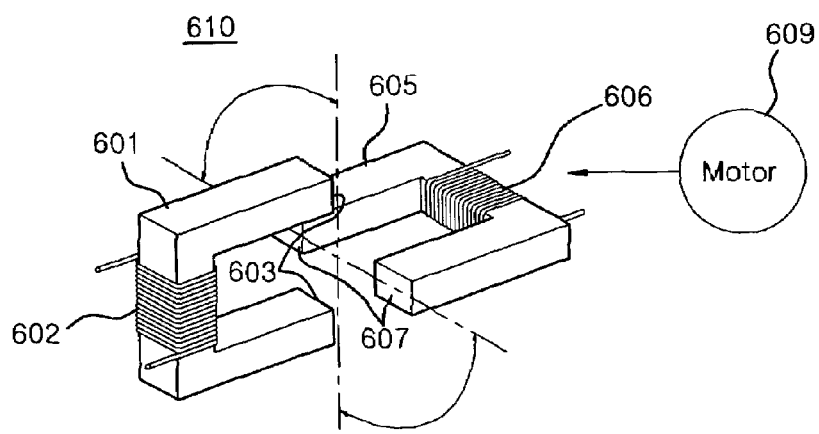
Figure 7C:
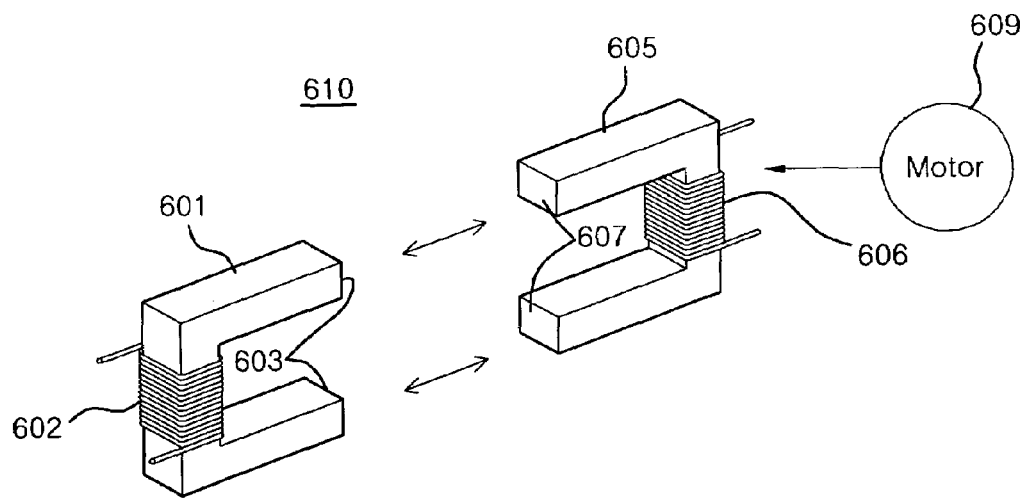

FIG. 6 is a perspective view of the variable transformer constituting the ignition power supply of FIG. 1, and FIGS. 7a to 7c are views for explaining a variable control mode of the variable transformer of FIG. 6.

Referring to FIG. 6, the variable transformer 610 constituting the ignition power supply 600 of FIG. 1 has a primary side winding coil 602 connected to the main power supply 400 (FIG. 1), and a secondary side winding coil 606 connected in parallel with the ignition electrodes 104, 114 and 124 (FIG. 1) of the inductively coupled plasma generators 101, 111 and 121, respectively.

The variable transformer 610 includes first and second magnetic cores 601 and 605, respectively, which have a horseshoe shape, and which have both ends disposed so as to face each other. The first and second magnetic cores 601 and 605, respectively, are wound with the primary and secondary side winding coils 602 and 606, respectively. The primary and secondary side winding coils 602 and 606, respectively, which are wound around the first and second magnetic cores 601 and 605, respectively, are not continuous windings.

The variable transformer 610 includes, for example, a driving unit 609, such as an electric motor. The driving unit 609 displaces the first and/or second magnetic cores 601 and/or 605, respectively, on the basis of the second control signal 702 from the controller 700, thereby varying the relative position between the first and second magnetic cores 601 and 605, respectively. For example, the degree of vertical or horizontal deflection (FIG. 7a), the rotational angle (FIG. 7b), or the relative distance (FIG. 7c) is varied. With this configuration, the amount of magnetic flux which is commonly concentrated in the first and second magnetic cores 601 and 605, respectively, increases or decreases so that induced electromotive force transmitted from the primary side winding coil 602 to the secondary side winding coil 606 is varied.

The ignition power supply 600, including the variable transformer 610, is controlled by the controller 700, thereby supplying the ignition electrodes 104, 114 and 124 of the inductively coupled plasma generators 101, 111 and 121, respectively, with high RF power for plasma ignition. After plasma discharge occurs, the variable transformer 610 operates under the control of the controller 700 so that power for plasma ignition is no longer supplied.

As set forth above, the process chambers 100, 110 and 120 constituting the multi-chamber plasma process system of the present invention have inductively coupled plasma generators 101, 111 and 121, respectively. However, their structures may be implemented in various ways as described below.

Figure 8:
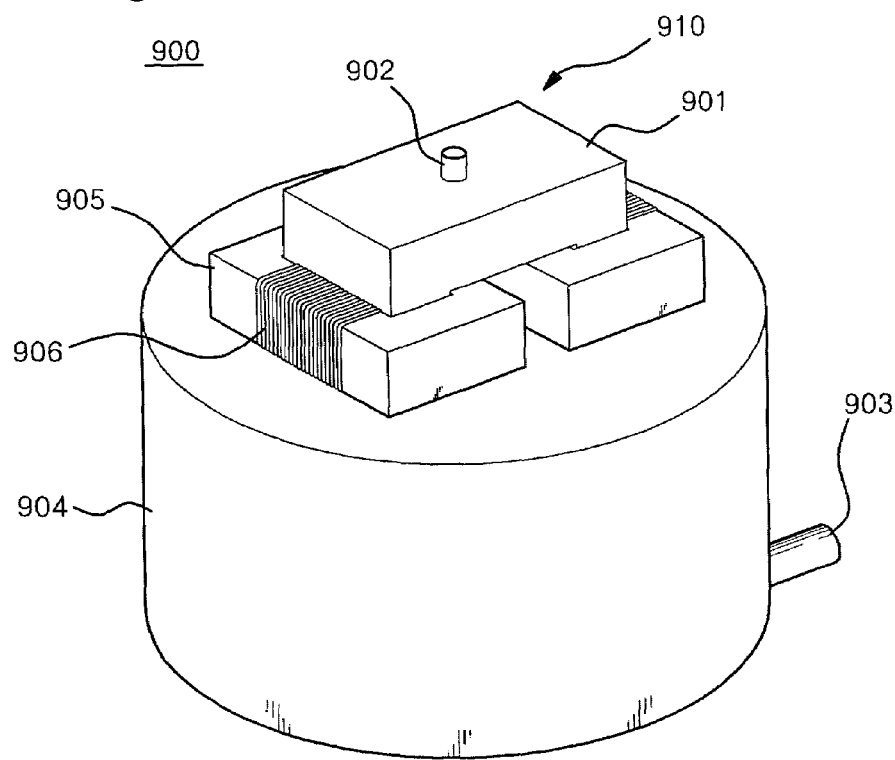
FIGS. 8 and 9 are a perspective view and a cross-sectional view, respectively, of a first embodiment of process chambers employed in the multi-chamber plasma process system of the present invention.
Figure 9:
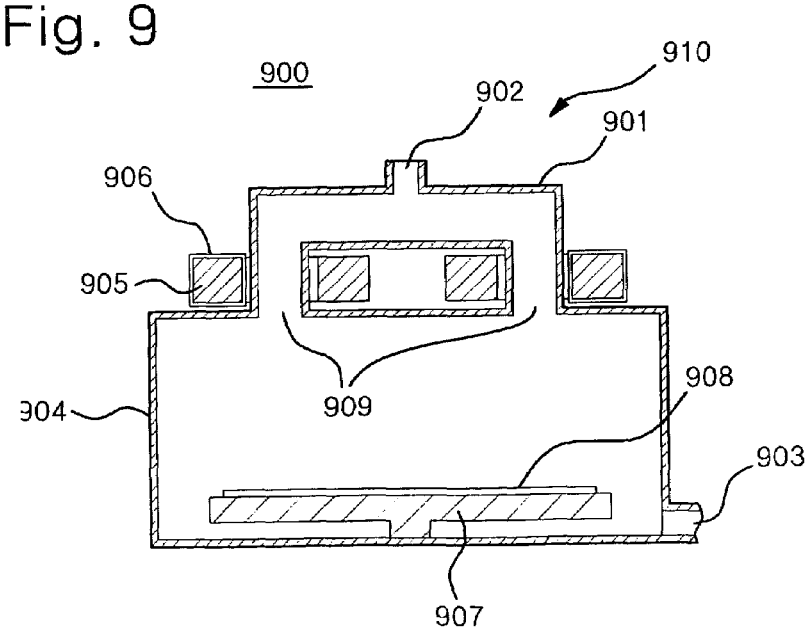
Figure 10:
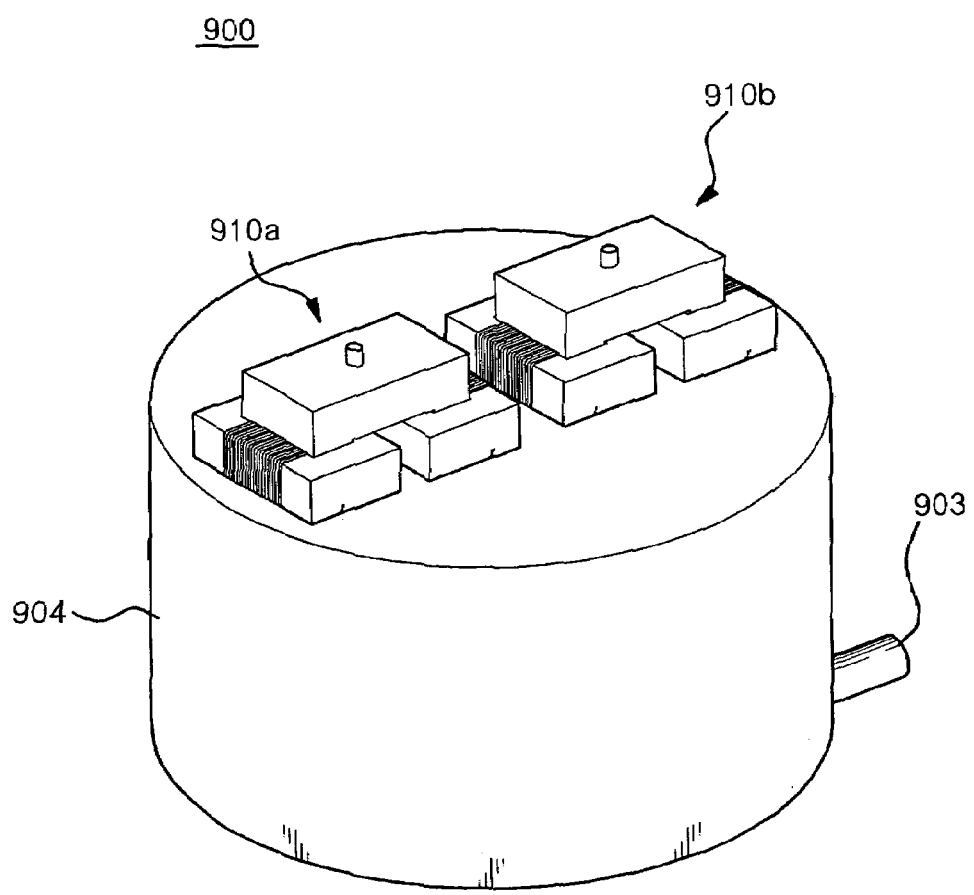
FIG. 10 is a perspective view showing a modification of the process chamber shown in FIG. 8.

FIGS. 8 and 9 are a perspective view and a cross-sectional view, respectively, of a first embodiment of process chambers employed in the multi-chamber plasma process system of the present invention, and FIG. 10 is a perspective view showing a modification of the process chamber shown in FIG. 8.

Referring to FIGS. 8 and 9, the process chamber 900 employed in the multi-chamber plasma process system of the present invention is composed of two or more holes 909 in the ceiling of a chamber housing 904, in which a susceptor 907 is housed. The susceptor 907 has a substrate 908 to be processed placed thereon. The two holes 909 are coupled with an inductively coupled plasma generator 910.

The inductively coupled plasma generator 910 has at least one external discharge bridge 901 of a hollow C shape, one side of which is coupled to the two holes 909. The external discharge bridge 901 has mounted thereon one or more donut-like magnetic cores 905, around each of which an induction coil 906 is wound. The coil 906 is connected to the main power supply 400 through the first impedance matcher 500 (FIG. 1). The external discharge bridge 901 is provided with a gas inlet 902 at the upper center thereof, and the chamber housing 904 is provided with a gas outlet 903 on the lower portion thereof.

In the process chamber 900 as constructed in this manner, electromotive force is induced by the induction coil 906, thereby forming a plasma discharge path in the respective interiors of the external discharge bridge 901 and the chamber housing 904. The process chamber 900 may have an insulator layer (not shown), for example of quartz, which is formed on the respective inner surfaces of the external discharge bridge 901 and the chamber housing 904 in order to prevent polymerization.

Referring to FIG. 10, in order to process a large area of the substrate 908 to be processed, the process chamber 900 may be provided with two or more inductively coupled plasma generators 910a and 910b located on the ceiling of the chamber housing 904. Due to the installation of the two or more inductively coupled plasma generators 910a and 910b, it is possible to generate plasma having a much wider volume and improved uniformity.

Figure 11:
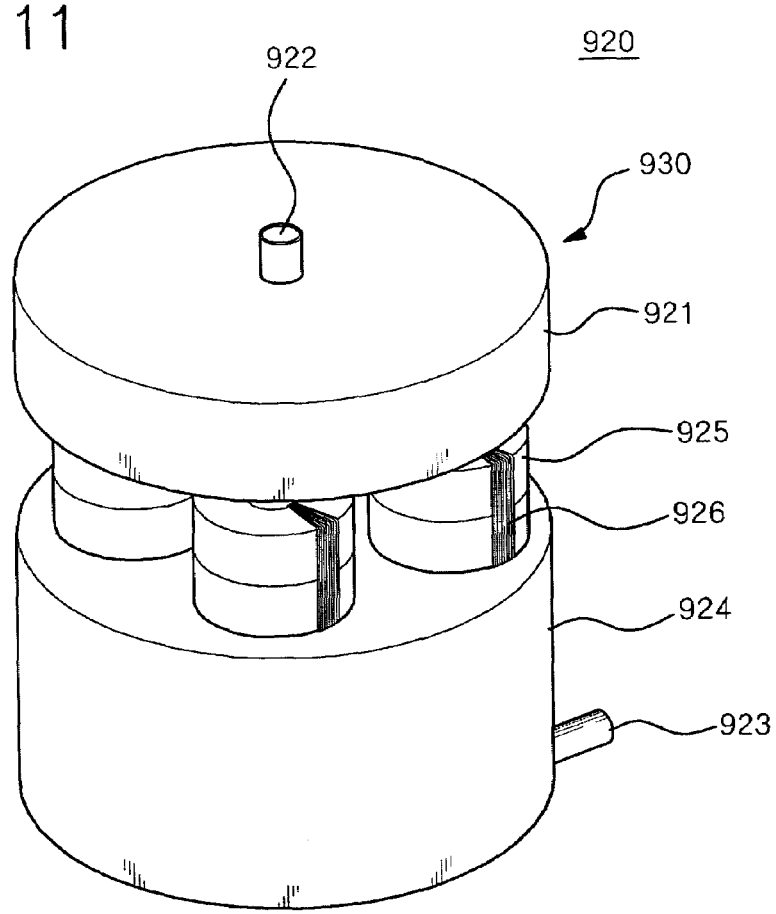
FIGS. 11 and 12 are a perspective view and a cross-sectional view, respectively, of a second embodiment of process chambers employed in the multi-chamber plasma process system of the present invention.
Figure 12:
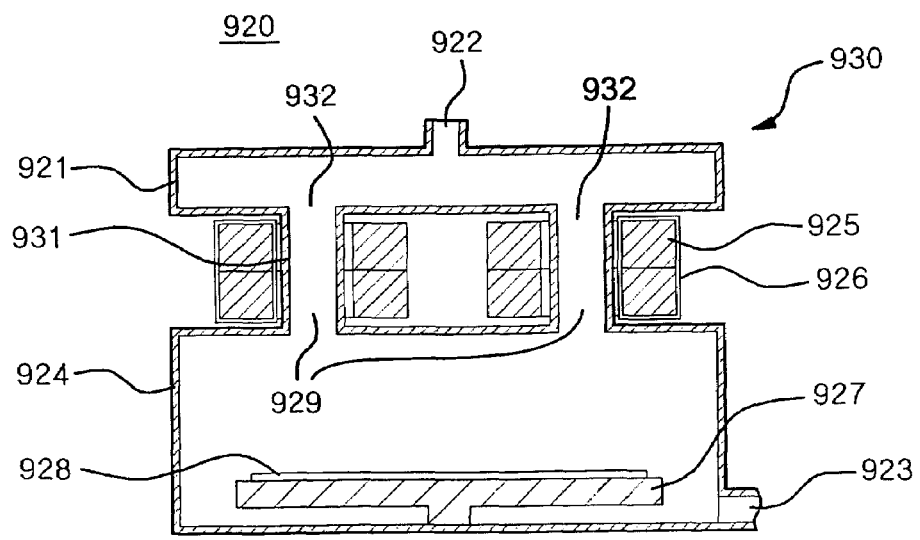

FIGS. 11 and 12 are a perspective view and a cross-sectional view, respectively, of a second embodiment of process chambers employed in the multi-chamber plasma process system of the present invention.

Referring to FIGS. 11 and 12, the process chamber 920 employed in the multi-chamber plasma process system of the present invention has a plurality of holes 929 in the ceiling of a chamber housing 924 in which a susceptor 927 is housed, and the susceptor 927 has a workpiece 928 to be processed disposed thereon. The plurality of holes 929 are coupled with an inductively coupled plasma generator 930.

The inductively coupled plasma generator 930 includes a hollow discharge tube head 921 and a plurality of hollow discharge tube bridges 931. The hollow discharge tube head 921 is provided on the lower surface thereof with a plurality of holes 932 corresponding to the plurality of holes 929 formed in the ceiling of the chamber housing 924, and is provided with a gas inlet 922 on the upper surface thereof. Each of the hollow discharge tube bridges 931 is connected between one of the holes 929 formed on the ceiling of the chamber housing 924 and one of the holes 932 formed on the lower surface of the hollow discharge tube head 921. In one embodiment, four hollow discharge tube bridges 931 are disposed in a tetragonal shape. To this end, the ceiling of the chamber housing 924 is provided with four holes 929, and the lower surface of the hollow discharge tube head 921 is provided with four holes 932.

Each of the hollow discharge tube bridges 931 has mounted thereon a magnetic core 925 of a donut shape, and the magnetic core 925 has wound thereon an induction coil 926 which is connected to the main power supply 400 through the first impedance matcher 500 (FIG. 1).

In this process chamber 920, electromotive force is induced by the induction coil 926, thereby forming a plasma discharge path which connects the interior of the hollow discharge tube head 921, the plurality of hollow discharge tube bridges 931 and the chamber housing 924. In this regard, all of the hollow discharge tube bridges 931 may have mounted thereon a magnetic core 925, around which the induction coil 926 is wound.

Furthermore, the magnetic core 925 may not be mounted on at least one of the hollow discharge tube bridges 931. However, the plasma discharge path is still formed inside the hollow discharge tube bridge 931 to which the magnetic core 925 and the induction coil 926 are not mounted. Furthermore, in order to process a large area of the substrate 928 to be processed, the number of hollow discharge tube bridges 931 may be increased.

As in the above-mentioned example, in order to prevent polymerization, the process chamber 920 may have an insulator layer (not shown), for example of quartz, which is formed on the respective inner surfaces of the hollow discharge tube head 921, the hollow discharge tube bridges 931 and the chamber housing 924 on the whole.

Figure 13:
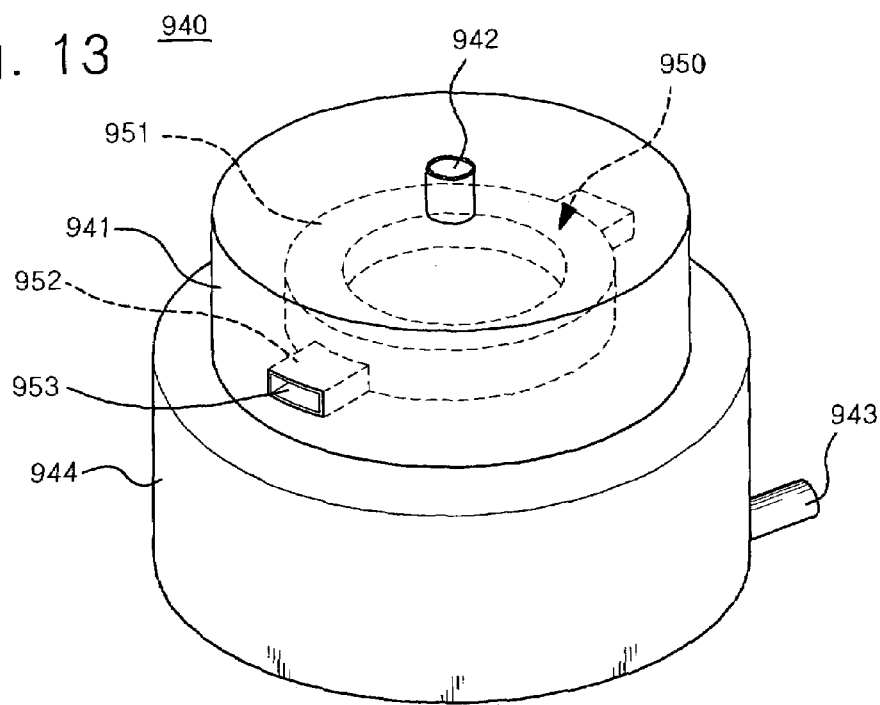
FIGS. 13 and 14 are a perspective view and a cross-sectional view, respectively, of a third embodiment of process chambers employed in the multi-chamber plasma process system of the present invention.
Figure 14:
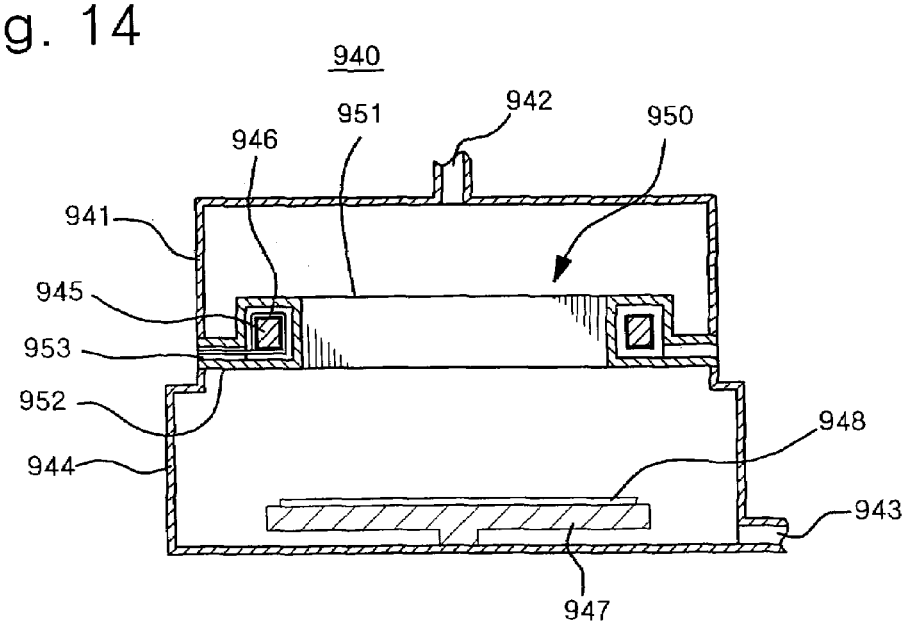

FIGS. 13 and 14 are a perspective view and a cross-sectional view, respectively, of a third embodiment of process chambers employed in the multi-chamber plasma process system of the present invention.

Referring to FIGS. 13 and 14, the process chamber 940 employed in a multi-chamber plasma process system of the present invention is provided with an inductively coupled plasma generator 950 located in the inner upper space of a chamber housing 944 in which a susceptor 947 is housed, and the susceptor 927 has a workpiece 948 to be processed placed thereon.

The inductively coupled plasma generator 950 includes an annular hollow core jacket 951 which is disposed in the inner upper space of the chamber housing 944. The hollow core jacket 951 has at least one fixing bridge 952 which extends from an upper sidewall 941 of the chamber housing 944 so as to be fixed in the upper space of the chamber housing 944. The hollow core jacket 951 has mounted thereon an annular magnetic core 945 and an induction coil 946 wound around the annular magnetic core 945.

In this process chamber 940, electromotive force is induced by the induction coil 946, thereby forming a plasma discharge path which surrounds the exterior of the hollow core jacket 951. Furthermore, in order to process a large area of the substrate 948 to be processed, the hollow core jacket 951 may be increased in size, and thus the magnetic core 945 may also be increased in size so as to be suitable for the size of the hollow core jacket 951. In addition, the hollow core jacket 951 and the magnetic core 945 may be increased in number.

As in the above-mentioned examples, in the process chamber 940, in order to prevent polymerization, the hollow core jacket 950 and the fixing bridge 952 may be formed of an insulator such as quartz, and the inner surface of the chamber housing 924 may also be covered with an insulator layer.

As set forth above, the multi-chamber plasma process system of the present invention may include various inductively coupled plasma generators in the plurality of process chambers as in the above-mentioned examples. Furthermore, as set forth below, each of the process chambers may include a regulator for regulating the density of plasma.

Figure 15:
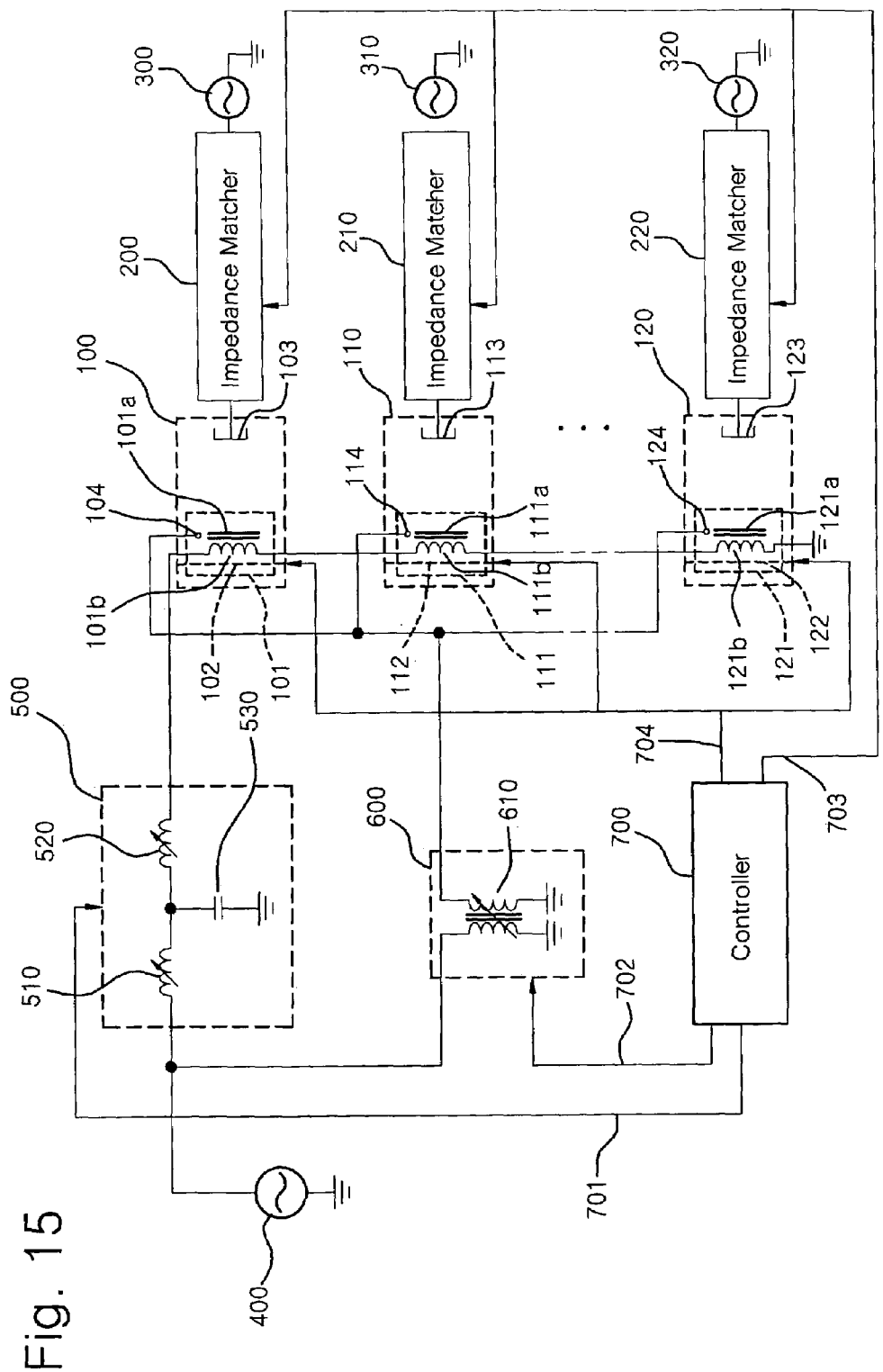
FIG. 15 is a circuit diagram of a multi-chamber plasma process system having a function of regulating the density of plasma.

FIG. 15 is a circuit diagram of a multi-chamber plasma process system having a function of regulating the density of plasma.

Referring to FIG. 15, a multi-chamber plasma process system having the function of regulating the density of plasma is basically constructed in a manner similar to that shown in FIG. 1. However, the plurality of process chambers 100, 110 and 120 are provided with plasma density regulators 102, 112 and 122, respectively, for regulating the density of plasma generated by the inductively coupled plasma generators 101, 111 and 121, respectively. The plasma density regulators 102, 112 and 122 are controlled by a third control signal 704 supplied by a controller 700.

As discussed below, each of the plasma density regulators is configured with a density regulation flat plate and a driving unit for driving the density regulation flat plate. The driving unit drives the density regulation flat plate based on the third control signal 704 from the controller 700.

Figure 16:
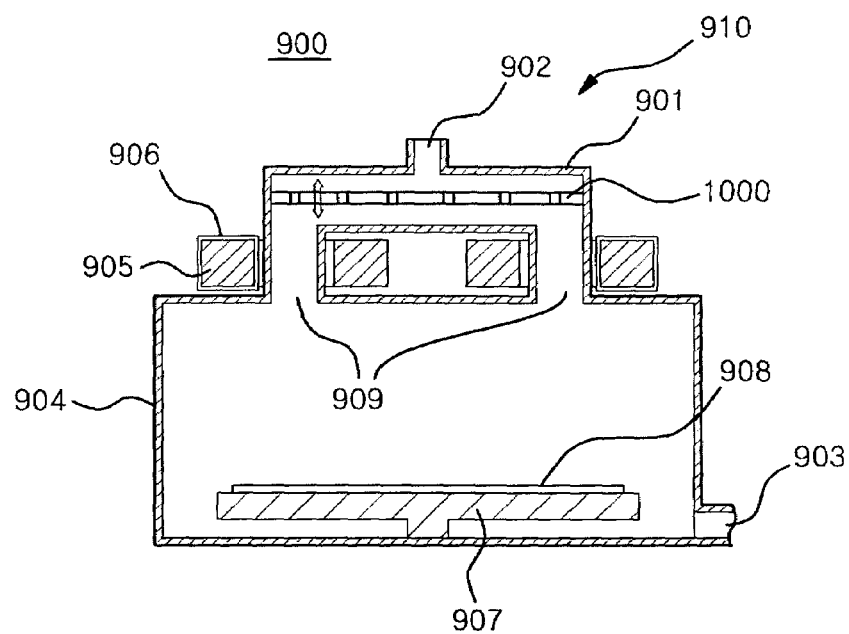
FIGS. 16, 17 and 18 are cross-sectional views showing respective examples of plasma density regulators provided in process chambers employed in the multi-chamber process system of the present invention.
Figure 17:
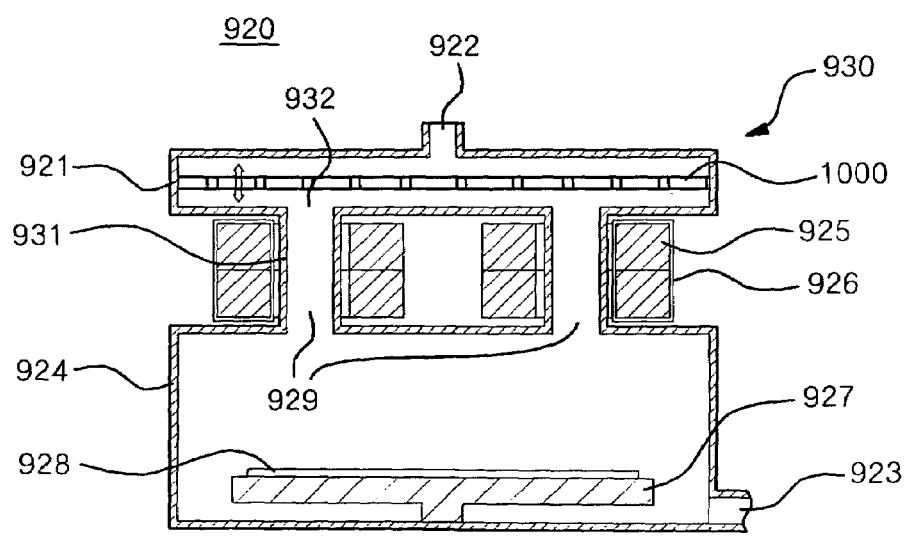
Figure 18:
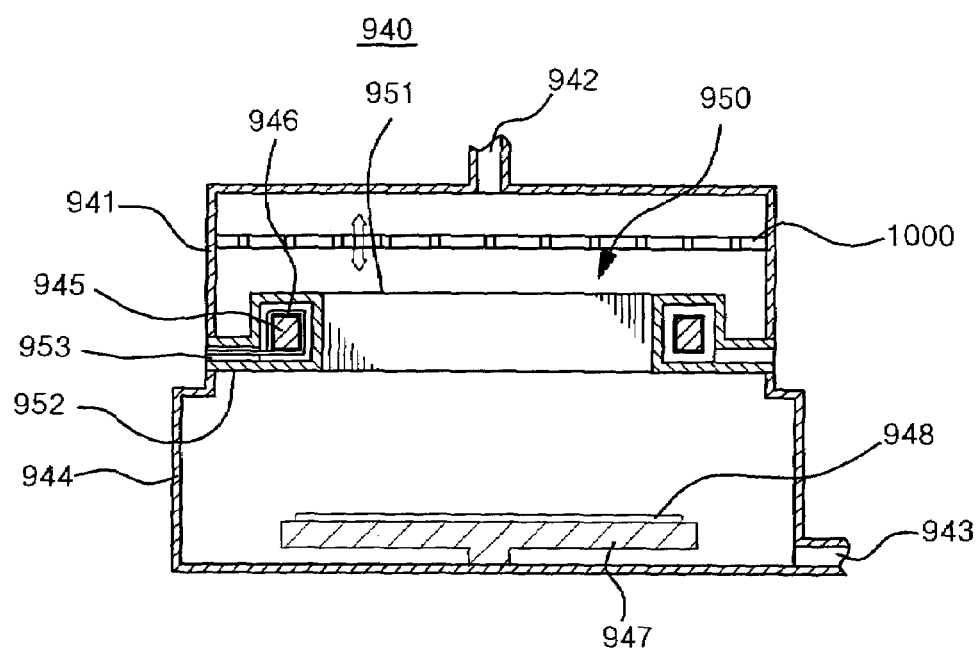

FIGS. 16, 17 and 18 are cross-sectional views showing respective examples of plasma density regulators provided in process chambers employed in the multi-chamber process system of the present invention.

As shown in FIG. 16, process chamber 900 has a density regulation flat plate 1000 mounted across the inner upper discharge space of an external discharge bridge 901, and the density regulation flat plate 1000 is provided with holes. The density regulation flat plate 1000 moves up and down by means of a driving unit (not shown). The driving unit may be variously configured; for example, a hydraulic or pneumatic value, or an electric motor and gear assembly, may be provided.

As shown in FIG. 17, process chamber 920 has a density regulation flat plate 1000 mounted across the inner upper space of a hollow discharge tube head 921. The density regulation flat plate 1000 moves up and down by means of a driving unit (not shown) as set forth above.

As shown in FIG. 18, process chamber 940 has a density regulation flat plate 1000 mounted across the inner upper space of a chamber housing 944 over a hollow core jacket 951. The density regulation flat plate 1000 moves up and down by means of a driving unit (not shown) as set forth above.

As discussed above, in the case of the process chambers 900, 920 and 940, as the density regulation flat plate 1000 moves upward, the plasma discharge space is increased, and thus the plasma density increases. In contrast, as the density regulation flat plate 1000 moves downward, the plasma discharge space is decreased, and thus the plasma density decreases. As such, it is possible to improve process yield by properly controlling the plasma density on the basis of process conditions or characteristics of each process chamber.

The above-mentioned multi-chamber plasma process system of the present invention is applied to various manufacturing processes, such as an ashing process, an etching process, a chemical vapor deposition process, etc. for manufacturing semiconductor devices or liquid crystal display devices, thereby improving the process yield.

In the above-mentioned multi-chamber plasma process system of the present invention, the power supply systems including the ignition power source, the RF power source, the impedance matcher, and so on can be effectively integrated. Thereby, it is possible to decrease the area of facilities and the cost of the multi-chamber plasma process system, and to individually control the plasma density in each process chamber. Accordingly, process yield improved, and as a result the productivity of the multi-chamber plasma process system can be further improved.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A multi-chamber plasma process system, comprising:
   a plurality of process chambers, each including a susceptor and an inductively coupled plasma generator having an ignition electrode;
   a main power supply for supplying radio frequency (RF) power for generating plasma to each said inductively coupled plasma generator;

a first impedance matcher connected between the main power supply and each said inductively coupled plasma generator;

an ignition power supply supplied with the RF power from the main power supply, and supplying ignition power to the ignition electrode provided in each said inductively coupled plasma generator;

a plurality of bias power sources for supplying bias power to the susceptors provided in the plurality of process chambers;

a plurality of second impedance matchers connected between the susceptors provided in the plurality of process chambers and the bias power sources supplying bias power to the susceptors; and a controller for controlling the first impedance matcher, the plurality of second impedance matchers, and the ignition power supply.

2. The multi-chamber plasma process system according to claim 1, wherein each said inductively coupled plasma generator is electrically connected in series to the main power supply through the first impedance matcher, and each said ignition electrodes is connected in parallel with the ignition power supply.

3. The multi-chamber plasma process system according to claim 1, wherein the plurality of process chambers have a stacked structure comprising one of a stacked arrangement of at least two process chambers and a cluster structure.

4. The multi-chamber plasma process system according to claim 1, wherein:

each of the first impedance matcher and the plurality of second impedance matchers includes at least one variable inductor for impedance matching;

the variable inductor includes first and second magnetic cores having a horseshoe shape and having respective ends disposed opposite to each other, first and second winding coils wound around the first and second magnetic cores, respectively, and a driving unit for moving at least one of the first and second magnetic cores based on control by the controller so as to vary a relative position between the first and second magnetic cores; and as the relative position between the first and second magnetic cores is varied, magnetic flux induced by the first and second winding coils has one of an aligned direction, a deflected direction, and an inverse direction, whereby inductance caused by the first and second winding coils is varied.

5. The multi-chamber plasma process system according to claim 1, wherein:

each of the first impedance matcher and the plurality of second impedance matchers includes at least one variable inductor for impedance matching;

the variable inductor includes first and second magnetic cores having a horseshoe shape and having respective ends disposed opposite to each other, first and second winding coils wound around the first and second magnetic cores, respectively, and a driving unit for moving at least one of the first and second magnetic cores based on control by the controller so as to vary a relative position between the first and second magnetic cores; and as a relative distance between the first and second magnetic cores is varied, magnetic flux induced by the first and second winding coils causes an amount of magnetic flux concentrated in the first and second magnetic cores to change, whereby inductance caused by the first and second winding coils is varied.

6. The multi-chamber plasma process system according to claim 1, wherein:

each of the first impedance matcher and the plurality of second impedance matchers includes at least one variable inductor for impedance matching;

the variable inductor includes first and second hollow tubes having respective ends opened and disposed in parallel, first and second continuous winding coils wound around the first and second magnetic cores, respectively, first and second magnetic cores which are mounted to the first and second hollow tubes, which have a horseshoe shape, and which have respective ends disposed opposite to each other, and a driving means for moving at least one of the first and second magnetic cores based on control by the controller so as to vary a relative distance between the first and second magnetic cores; and as the relative distance between the first and second magnetic cores is varied, magnetic flux induced by the first and second winding coils causes an amount of magnetic flux concentrated in the first and second magnetic cores to change, whereby inductance caused by the first and second winding coils is varied.

7. The multi-chamber plasma process system according to claim 6, wherein the first and second hollow tubes are formed of an insulator.

8. The multi-chamber plasma process system according to claim 1, wherein:

the ignition power supply includes a variable transformer connected to the power supply on a primary side thereof, and connected in parallel with each said ignition electrode;

the variable transformer includes first and second magnetic cores having a horseshoe shape and having respective ends disposed opposite to each other, a first winding coil wound around the first magnetic core, a second winding coil wound around the second magnetic core, and driving means for moving at least one of the first and second magnetic cores based on control by the controller so as to vary a relative position between the first and second magnetic cores; and as the relative position between the first and second magnetic cores is varied, magnetic flux induced by the first and second winding coils has one of an aligned direction, a deflected direction, and an inverse direction, whereby inductance caused by the first and second winding coils is varied.

9. The multi-chamber plasma process system according to claim 1, wherein:

the ignition power supply includes a variable transformer connected to the power supply on a primary side thereof, and connected in parallel with each said ignition electrode;

the variable transformer includes first and second magnetic cores having a horseshoe shape and having respective ends disposed opposite to each other, a first winding coil wound around the first magnetic core, a second winding coil wound around the second magnetic core, and driving means for moving at least one of the first and second magnetic cores based on control by the controller so as to vary a relative position between the first and second magnetic cores; and as a relative distance between the first and second magnetic cores is varied, magnetic flux induced by the first and second winding coils causes an amount of magnetic flux concentrated in common in the first and second magnetic cores to change, whereby an induced electromotive force transmitted from the primary winding coil to the secondary winding coil is varied.

10. The multi-chamber plasma process system according to claim 1, wherein each of said process chambers has at least two holes formed in a ceiling of a chamber housing in which the susceptor is disposed, the susceptor having a substrate to be processed disposed thereon;

wherein each said inductively coupled plasma generator includes at least one external discharge bridge having a hollow C shape and having a side coupled to said at least two holes, at least one donut-like magnetic core mounted on said at least one external discharge bridge, and an induction coil wound around said at least one donut-like magnetic core and connected to the main power supply through the first impedance matcher; and wherein the induction coil induces electromotive force to form a plasma discharge path inside the external discharge bridge and inside the chamber housing.

11. The multi-chamber plasma process system according to claim 10, wherein the external discharge bridge and the chamber housing have an insulator layer formed on inner surfaces thereof.

12. The multi-chamber plasma process system according to claim 10, wherein:

each said inductively coupled plasma generator includes a plasma density regulator;

the plasma density regulator includes a density regulation flat plate mounted across an inner upper discharge space of the external discharge bridge and provided with holes, and driving means for moving the density regulation flat plate up and down; and the plasma is increased in density as the density regulation flat plate is moved upward, and the plasma is decreased in density as the density regulation flat plate is moved downward.

13. The multi-chamber plasma process system according to claim 1, wherein each said process chamber has a plurality of holes formed in a ceiling of a chamber housing in which the susceptor is disposed, the susceptor having a substrate to be processed disposed thereon;

wherein each said inductively coupled plasma generator includes:
a hollow discharge tube head having a plurality of holes formed on a lower surface thereof in correspondence to the plurality of holes formed in the ceiling of the chamber housing, and having a gas inlet on an upper surface thereof;
a plurality of hollow discharge tube bridges, each connected between the plurality of holes formed on the ceiling of the chamber housing and the plurality of holes formed on the lower surface of the hollow discharge tube head;
a donut-like magnetic core mounted on each of the hollow discharge tube bridges; and
an induction coil wound around the donut-like magnet core and connected to the main power supply through the first impedance matcher;
wherein the induction coil induces electromotive force to form a plasma discharge path connecting interiors of the hollow discharge tube head, the plurality of hollow discharge bridges, and the chamber housing.

14. The multi-chamber plasma process system according to claim 13, wherein the magnetic core is not mounted to at least one of the plurality of hollow discharge bridges.

15. The multi-chamber plasma process system according to claim 13, wherein each of the hollow discharge tube head, the plurality of hollow discharge bridges and the chamber housing has an insulator layer formed on an inner surface thereof.

16. The multi-chamber plasma process system according to claim 13, wherein:

each said inductively coupled plasma generator includes a plasma density regulator;

the plasma density regulator includes a density regulation flat plate mounted across an inner discharge space of the hollow discharge tube head and formed with holes, and driving means for moving the density regulation flat plate up and down; and the plasma is increased in density as the density regulation flat plate is moved upward, and the plasma is decreased in density as the density regulation flat plate is moved downward.

17. The multi-chamber plasma process system according to claim 1, wherein each of the plurality of process chambers has an inductively coupled plasma generator disposed in an inner upper space of a chamber housing in which the susceptor is disposed;

wherein each said inductively coupled plasma generator includes:
an annular hollow core jacket positioned in the upper space of the chamber housing;
a hollow discharge tube head having a plurality of holes formed on a lower surface thereof in correspondence to the plurality of holes formed in the ceiling of the chamber housing, and having a gas inlet on an upper surface thereof;
a plurality of hollow discharge tube bridges, each connected between the plurality of holes formed on the ceiling of the chamber housing and the plurality of holes formed on the lower surface of the hollow discharge tube head;
at least one fixing bridge extending from an upper sidewall of the chamber housing to the hollow core jacket so as to fix the hollow core jacket in the upper space of the chamber housing;
an annular magnetic core mounted in the hollow core jacket; and
an induction coil wound around the annular magnetic core;
wherein the induction coil induces electromotive force to form a plasma discharge path surrounding an exterior of the hollow core jacket.

18. The multi-chamber plasma process system according to claim 17, wherein the hollow core jacket and the fixing bridge are formed of an insulator, and the chamber housing has an insulator layer formed on an inner surface thereof.

19. The multi-chamber plasma process system according to claim 17, wherein:

each said inductively coupled plasma generator includes a plasma density regulator;

the plasma density regulator includes a density regulation flat plate mounted across an inner upper space of the chamber housing over the hollow core jacket, and driving means for moving the density regulation flat plate up and down; and the plasma is increased in density as the density regulation flat plate is moved upward, and the plasma is decreased in density as the density regulation flat plate is moved downward.

* * * * *